United States Patent [19]

Smith

[11] Patent Number: 5,748,955
[45] Date of Patent: May 5, 1998

[54] STREAM DATA COMPRESSION SYSTEM USING DYNAMIC CONNECTION GROUPS

[76] Inventor: Rodney J. Smith, 21 Baroda St., Khandallah, Wellington, New Zealand

[21] Appl. No.: 666,332
[22] PCT Filed: Dec. 20, 1994
[86] PCT No.: PCT/NZ94/00146
 § 371 Date: Sep. 11, 1996
 § 102(e) Date: Sep. 11, 1996
[87] PCT Pub. No.: WO95/17783
 PCT Pub. Date: Jun. 29, 1995

[30] Foreign Application Priority Data

Dec. 20, 1993 [NZ] New Zealand .................. 250522

[51] Int. Cl.$^6$ .................. G06F 17/30; G06F 15/16
[52] U.S. Cl. .................. 395/612; 395/615; 395/200.77
[58] Field of Search .................. 395/60, 61, 62, 395/200, 77, 888

[56] References Cited

U.S. PATENT DOCUMENTS 4,491,934 1/1985 Heinz .................. 341/55

FOREIGN PATENT DOCUMENTS

WO88/09586 12/1988 WIPO .

OTHER PUBLICATIONS

"Algorithm to Identify Common Phrases in Source Text," IBM Technical Disclosure Bullentin, vol. 33, No. 12, May 1991, pp. 150–152.

Primary Examiner—Wayne Amsbury
Attorney, Agent, or Firm—Killworth, Gottman, Hagan & Schaeff, L.L.P.

[57] ABSTRACT

A generalized system for compression of data such as text or images. Compression is achieved by identifying new connections between consecutive data units, existing connections or both. A representation of each new connection is then used to replace the consecutive items throughout the data, which are typically considered in pairs. A hierarchical connection structure resembling a tree is built up as data is received, so that the effectiveness of compression increases with time. After each session of data reception, the initially compressed data may be reorganized with new connections being identified and stored in an index for future use, while also further compressing the existing data.

19 Claims, 15 Drawing Sheets

901  903
  |  a  | 103765 |   902
  100586

|  s  | 176094 |
  100594

|  e  | 105406 |
  100602

|  o  | 116746 |
  100610

|  t  | 154876 |
  100618

|  d  | 103987 |
  100626

|  m  | 118555 |
  100634

|  u  | 200164 |
  100642

|  c  | 219550 |
  100650

|  n  | 198061 |
  100666

|  y  | 254766 |
  100674

|  p  | 219083 |
  100682

|  h  | 310998 |
  100686

FIG. 9

| 1001 | 1003 | 1004 | 1005 | 1006 | |
|---|---|---|---|---|---|
| 100650 | 100586 | 476580 | 249586 | | 1002 |
| 219550 | | | | | |

| 100650 | 100602 | 265498 | 327645 | |
|---|---|---|---|---|
| 249586 | | | | |

| 100650 | 100610 | 220499 | 340989 | |
|---|---|---|---|---|
| 327645 | | | | |

| 100650 | 100642 | 476650 | 370968 | |
|---|---|---|---|---|
| 340989 | | | | |

| 100650 | 100658 | 365485 | 487657 | |
|---|---|---|---|---|
| 370968 | | | | |

| 100650 | 100650 | 978605 | 498760 | |
|---|---|---|---|---|
| 487657 | | | | |

| 100650 | 100674 | 476586 | 499031 | |
|---|---|---|---|---|
| 498760 | | | | |

⋮

| 100650 | 100686 | 574601 | 0 | |
|---|---|---|---|---|
| 536510 | | | | |

FIG. 10

| 327645 | 100586 | 478576 | 243765 | |
|---|---|---|---|---|
220499

| 327645 | 100610 | 336547 | 260021 | |
|---|---|---|---|---|
243765

| 327645 | 100666 | 765465 | 276453 | |
|---|---|---|---|---|
260021

| 327645 | 100682 | 436547 | 327651 | |
|---|---|---|---|---|
276453

| 327645 | 100634 | 789012 | 378654 | |
|---|---|---|---|---|
327651

| 327645 | 100618 | 375110 | 419687 | |
|---|---|---|---|---|
378654

⋮

| 327645 | 100674 | | 0 | |
|---|---|---|---|---|
590971

FIG. 11

| DATA UNIT | ARRAY LOC. 1 | ARRAY LOC. 2 | ARRAY LOC. 3 | ARRAY LOC. 4 | ARRAY LOC. 5 |
|---|---|---|---|---|---|
| c | 100650 | | | | |
| o | 100650 | 100610 | | | |
| | 327645 | | | | |
| m | 327645 | 100634 | | | |
| | 327651 | | | | |
| p | 327651 | 100682 | | | |
| | 795228 | | | | |
| a | 795228 | 100586 | | | |
| n | 795228 | 100586 | 100666 | | |
| | 795228 | 321098 | | | |
| y | 795228 | 321098 | 100674 | | |
| | 795228 | 678901 | | | |
| | 890123 | | | | |

RECEIVED
| c | o | m | p | a | n | y | |
STORED
| 890123 | | | | | | | |
RETRIEVED
| c | o | m | p | a | n | y | |
FIG. 14
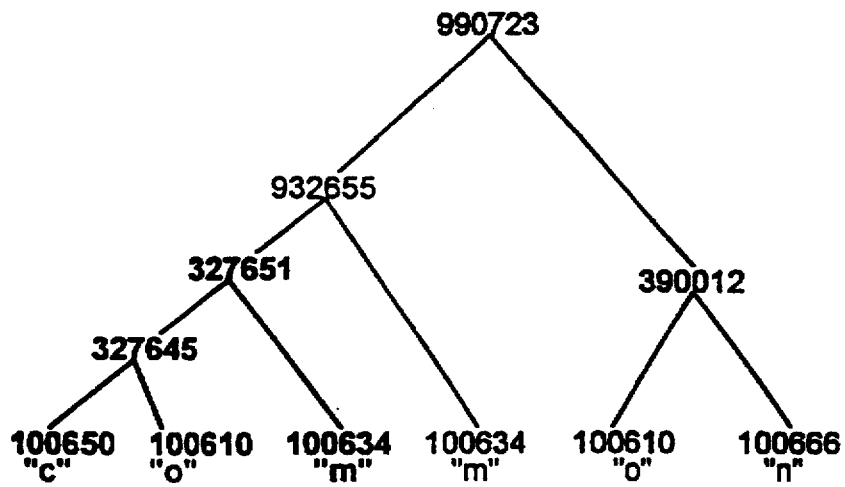
FIG. 15
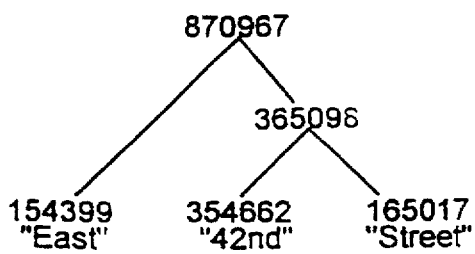
FIG. 16

STREAM DATA COMPRESSION SYSTEM USING DYNAMIC CONNECTION GROUPS

BACKGROUND OF THE INVENTION

This invention relates to compression of data in computer information systems, and more particularly to a memory structure and also to methods which provide a means of storing information in and retrieving information from that structure.

One of the most common uses of computers is that of storing information. In business, this is typically done by a user entering data into a display screen via a keyboard, which is then stored in computer memory, either volatile or permanent, such as RAM or rotating disk memory. Also, today, data such as images of documents and photographs is commonly entered into computers via a scanner. Many other types of data, such as sounds, video images and the output of scientific instruments may be stored in computers.

Before storing information, a computer, via the appropriate peripheral device, and in some cases with the help of the operating system, first breaks down the information into discrete units of data, which will be called "data units". For example, sound may be broken down into separate audio samples, images into discrete pixels, and keyboard characters are transmitted from the keyboard in the form of a series of discrete codes. The discrete units are then recorded as digital data in computer memory.

In order to retrieve information from a computer, the stored discrete data units are played back, via a suitable device, which re-creates the original type of data (an image, sounds, characters etc.) with the appropriate values in the right order, and in so doing, creates a new instance of the original information.

Perhaps the clearest example is that of character data. In the case of this data type, data from the keyboard is typically stored in computer memory as a digital form of the characters which are typed. Most computer operating systems and database management systems record typed information in a 1:1 ratio. For example, the typed word "hello" is typically stored as five letters. This is, five data units exist outside computer storage and five data units are stored inside.

Some languages such as Chinese require multi-byte character sets. Even though more than one byte of storage may be required to store a single character, these characters are still stored in a 1:1 ratio because each character outside computer memory is separately recorded as a single character inside computer memory.

Recording information in a 1:1 ratio can result in inefficient use of storage space. This is particularly so in respect of large amounts of information which contain contiguously repeated data of the same values; that is, information such as images, sounds and large text documents. For examples: text typically includes repeated blanks: images of documents, significant area of white; and pictures, various areas of the same colour and intensity.

Some computer operating systems use data compression methods to reduce the amount of space required to store information. For example, rather than store 30 typed spaces, such an operating system might store one space and the number 30 along with a flag to indicate that this information is compressed. A variety of compression algorithms are nowadays commonly employed in operating systems to reduce the space required to store contiguous repetitions of the same data values. Such algorithms cannot compress non-contiguous repetitions of data values. Other algorithms may compress non-contiguous data, but rely on pre-existing dictionaries of code words which are generally fixed before the algorithms are used.

Compression algorithms, traditionally part of major operating systems such as VMS and VS, may be a separate product in respect of smaller operating systems, such as earlier releases of MS-DOS, which do not have compression. Whether an integral part of an operating system or added later, compression algorithms perform an operating system role, that is, they are part of the low-level interface between applications and hardware.

Compression algorithms often function in a client-sever relationship with other parts of an operating system. Typically, uncompressed data is supplied to the algorithm by another part of the operating system, called the "client process". The algorithm compresses the data and hands it back, for the client process to use as it wishes. For example, data, once compressed, may be stored by a client process or a derivative of it in a field in a file, or it might be sent to a modem, or it might be used in some other way. The way it is used is not directly of interest to the particular compression algorithm, although different uses may benefit from different algorithms. The same goes for decompression.

Due to the falling price of computers and particularly computer memory, both volatile and permanent, a recent trend in computer use has been towards the storage of large data objects such as video images, songs, spoken conversations and large bodies of text.

SUMMARY OF THE INVENTION

The present invention is a method in an information system which allows compression of non-contiguous groups of data units. It involves a general-purpose memory structure whose contents may be any type(s) of information; and it embodies a general-purpose method for organising that structure and its contents.

The invention may be used in a variety of different ways whose primary utility may not be limited to or may not relate to efficiencies in data compression. The purpose or use of the present invention is therefore expressly not limited to the purpose and use exemplified in the embodiments described herein. In may also be used in a wide variety of computer based systems where larger amounts of data are stored or electronically transmitted to another site.

The invention may broadly be said to consist in a method of compressing data, comprising the steps of assigning to each data unit a code, recording a repetition of code sequences and upon a pre-determined threshold of repetition of any particular sequence assigning to that code sequence new code, and using a hierarchal structure built with data units and established code sequences to form higher level code sequences.

More particularly the invention may be said to consist in a method of compressing data by computer, in which connection groups of two or more consecutive data units are identified and recorded as compression proceeds, comprising:

receiving a stream of data units to be compressed, storing a record of each received data unit in a processing block of computer memory, determining whether each received data unit forms an already identified connection group existing in an index block of computer memory, when considered in relation to any immediately preceding data unit or connection group recorded in said processing block, storing in said processing block a fresh record of any such already identified connection group formed by said received data unit, in place of said received data unit and said immediately preceding data unit or connection group recorded in said processing block, determining whether each connection group freshly recorded in said processing block forms a larger already identified connection group existing in said index block, when considered in relation to any respective immediately preceding data unit or connection group recorded in said processing block, storing a further fresh record of any such larger already identified connection group, in place of said connection group freshly recorded in said processing block and said respective immediately preceding data unit or connection group recorded in said processing block, delivering the records stored in said processing block for further storage or for transmission as required, once said stream of data units has been received and compressed.

As a further feature the invention may be said to consist in a method in which at least one data stream has been received, initially compressed and stored, further comprising:

determining a number of occurrences of at least one pair of consecutive records in said initially compressed data, determining whether the number of occurrences of said at least one pair of consecutive records exceeds a threshold number, storing in said index block a record of a new connection group for any such pair of consecutive records in said initially compressed data having a number of occurrences greater than said threshold number, storing in said initially compressed data a record of said new connection group in place of each occurrence of said consecutive pair of records which said new connection group represents.

BRIEF DESCRIPTION OF THE DRAWINGS

The above described advantages and operation of the present invention will be more fully understood upon reading the following description of the preferred embodiment in conjunction with the drawings, of which:

FIG. 9 illustrates the contents of part of a values block.

FIG. 10 illustrates part of an index block, specifically a number of connections which constitute the chain associated with the data value "c".

FIG. 11 illustrates the contents of part of an index block, specifically being a number of connections which constitute part of the chain associated with the connection which yields the values "co".

FIG. 14 illustrates the units of received data, corresponding unit of stored data, and the corresponding units of retrieved data.

FIG. 15 illustrates a structure of connections part of which contains the same sub-structure as the connection illustrated in FIG. 12.

FIG. 16 illustrates a structure of connection in respect of a data unit type of words.

DETAILED DESCRIPTION OF THE PREFERRED EMBODIMENT

Figure 1:
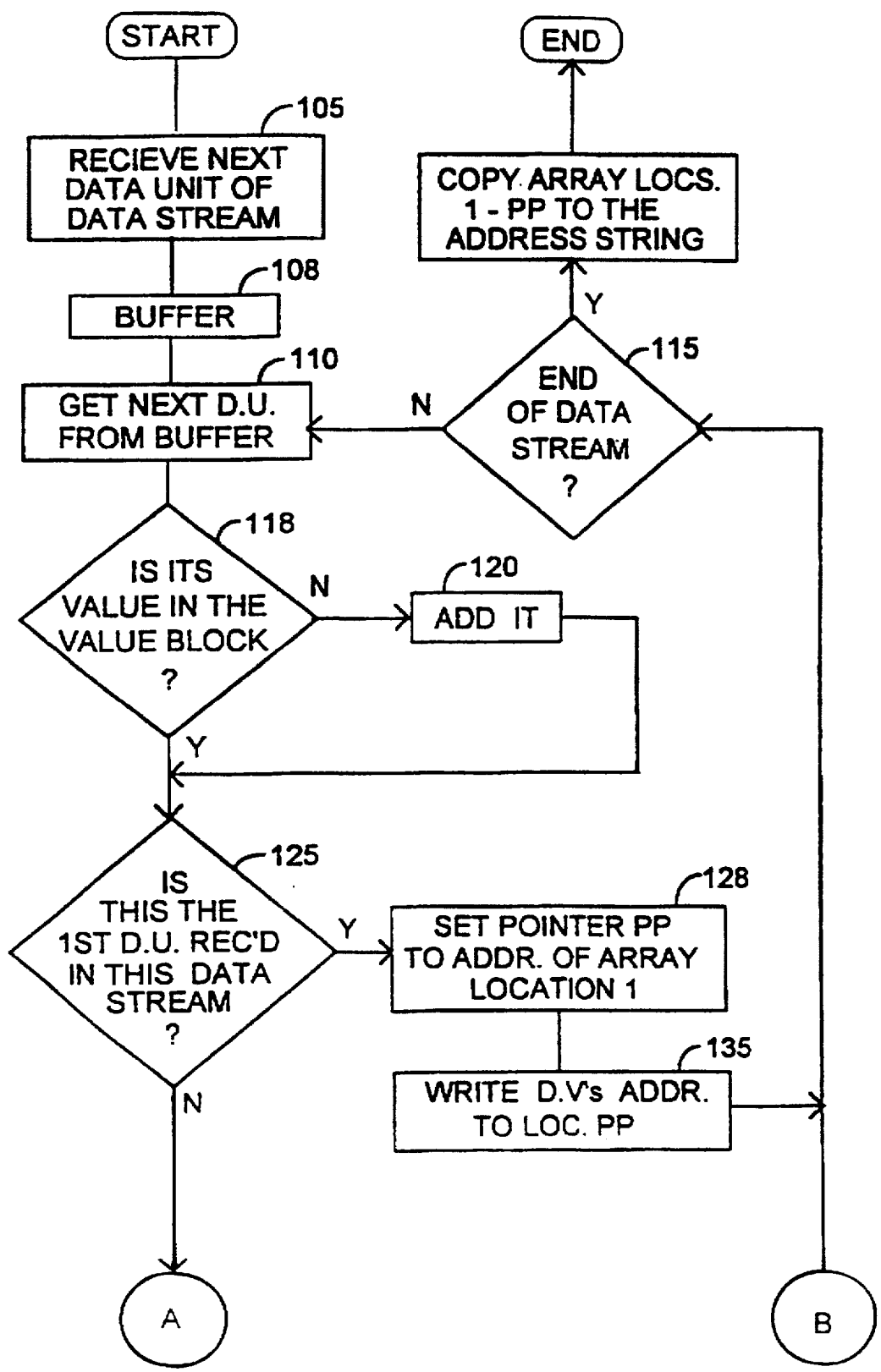
FIG. 1 and FIG. 2 form a flowchart illustrating the receiving process.

A preferred embodiment of the present invention is disclosed herein: however, it is to be understood that the disclosed embodiment is merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

The values in the diagrams of particular address/contents numbers are smaller than might in a given embodiment be the case. Smaller numbers have been used to aid clarity. In respect of the diagrams, character data units have been used to assist clarity and economy of space. This should not be interpreted as conferring any particular importance to this data type and data unit type. Written examples are given in respect of a data unit of words to assist easy understanding.

Before going further it is necessary to clarify some terminology. There is a problem with saying "the address of the integer is at the first position in the string". This statement may mean either that the first position in the string contains a number which identifies the memory location at which the integer starts, or alternatively, that the integer starts at the first position in the string. Accordingly, when the number is the subject of attention, the term "address" is used; and when the place itself is the issue, "location" is used.

Furthermore, "the item is stored at address such and such" is understood to mean that the item is stored in memory starting at the location whose address is such and such, and that the item, depending on what type of item it is, may occupy more than one addressable unit of storage space. In such cases, the term "the next available address" is understood to take into account the number of addressable units of storage space that items require.

In addition, when statements are made such as "the operating system executes a read operation and reads the address then transfers its attention to the connection starting at the location identified by that address", it is understood and is consistent with the present invention that operations described by such statements may be encapsulated in some different form or facility of a particular computer programming language, and in respect of that programming language, may be referred to using names which are different to those used herein. The descriptions contained herein are intended to be generic, and to not pre-suppose any particular language.

The system which manages the operation of the present invention is called herein the "operating system" and this is understood herein to mean only the operation of the present invention, rather than to other aspects of a computer system.

The present invention is a method of storing information such that new information may be stored in a relatively smaller amount of space. This is achieved by maintaining an index which represents commonly repeated groups of data units that have been received in the past. When a new data stream is received which contains an instance of an indexed group, all that need be stored is a code, typically the address of the location in the index of that group, rather than the group itself. For example, if the data "Sunset Boulevard" is received, and representation of its exists in the index at, say, address 123456, all that need be stored is a single number (the memory address 123456) rather than 16 characters.

Therefore, the present invention is conceptually divided into three processes: the receiving process, the reorganising process, and the retrieving process.

The receiving process manages the receipt and processing of new data streams. Data streams are composed of data units: for example characters, audio samples, image pixels. The inputs to the receiving process are the new data stream, and entries in the index. The output is a sequence of addresses which represents the received data stream, and it is this sequence of addresses which is handed back to the client process or on to another process.

The reorganisation process adds new information to the index based on repetitions in address sequences stored since the last reorganisation session. The inputs to the reorganisation process are stored address sequences, and existing entries in the index. The output is additional entries in the index, and optionally, changes to address sequences.

The retrieval process manages the retrieval of information which was previously stored. The inputs to the retrieval process are stored address sequences, and entries in the index. The output from the retrieval process is the information which was originally stored, that is, a new instance of the original data stream, and it is this sequences of values that is handed back to the client process or on to another process.

Memory is conceptually divided according to its use into 3 blocks: the value block, index, and processing block. Such memory may be volatile or permanent, or consist of a combination of both. For example, a given embodiment may instantiate processing memory as RAM, and the index and value blocks as rotating disk memory.

The values block holds a single instance of each different data unit value that has been received in the past. Different types of data may be received, including, sound samples, image pixels, and characters; and within a single data type, there may in different instances, be different types of data units. For example, the character data type might consist of a data unit type of characters or a data unit type of words. In respect of discrete characters, the values block would contain an instance of each character received to date. In respect of a character data unit type of words, the values block would contain an instance of each different word received to date.

For the purpose of clarity, data values are allocated their own (conceptual) memory block, but they are really part of the index. Associated with a data value is a location reserved for the address, called the "associated address", of a chain. A chain is a group of connections in the index. An example portion of a values block is shown in FIG. 9 and will be explained in detail below.

The index block consists of connections. Typically, a mature index block contains a number of connections. A connection is a group of values. The address of the memory location at which the first value starts is called the address of the connection. A connection conceptually connects two memory locations. A connection is said to have a direction, which is from the first location connected, to the second. Connections themselves may be grouped together into chains. A chain consists of all the one or more connections which are connected to the same first location. The address of the first connection in a chain is called the address of the chain.

Figures 12, 13:
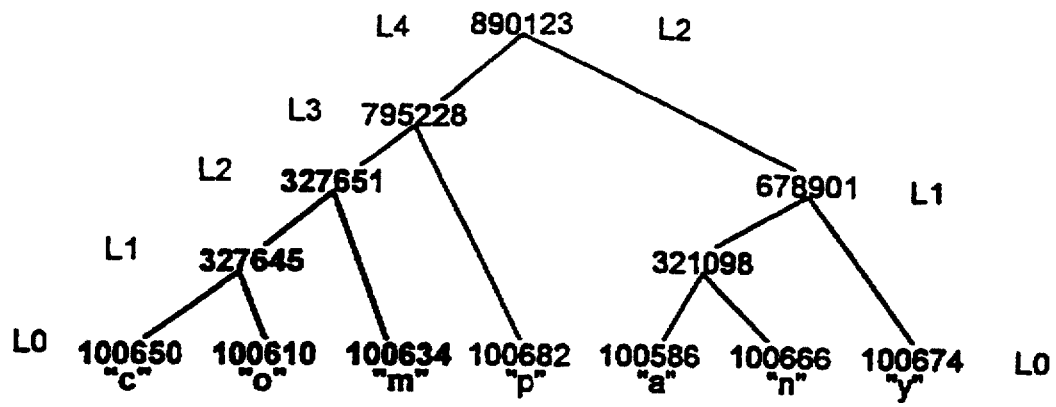
FIG. 12 illustrates a structure of connections which yields the values "company". The parts printed in bold face relate to parts of FIG. 9, FIG. 10, FIG. 11, FIG. 13, and FIG. 15 printed in bold face.
FIG. 13 illustrates the contents over time of part of a processing array. The rows relate to the receipt of data units over time, and the second and subsequent columns to the contents of processing array locations.

Connections may form a hierarchical connection structure. A connection structure looks diagrammatically like an inverted tree, with one connection at the apex, and data values at the bottom. The nodes in the tree structure, that is the places where a branching occurs, are connections, and connections in the structure are said to be on different levels. The lowest level is at the bottom and the highest at the top. An example connection structure is shown in FIG. 12 and will be explained in detail below.

It should be noted, however, that the structures formed by a group of connections will not necessarily represent meaningful words. Connections may be formed between a common suffix of one word, such as "ing", an intervening space, and a common prefix of a following word, such as "an". Spaces may therefore be treated in the same manner as other characters during the receiving, reorganising and retrieving processes.

A connection contains four reserved places and other information used by the operating system. In respect of the present embodiment, the first place in the connection is reserved for the address of the first of the two locations between which the connection subsists. The second place is reserved for the address of the second location. The third place is reserved for the address of the associated chain, if any, that is, for the address of the chain in the next level up. The fourth place is reserved for the address of the next connection, if any, in the chain on the same level, and of which the current connection forms a part. An example of a number of connections forming a chain is shown in FIGS. 10 and 11 and will be explained in more detail below.

The processing block provides a number of structures of reserved locations which may be used by the receiving, reorganising and retrieving processes for a number of purposes including temporary storage and manipulation of addresses. A structure called the "input string", may be used by the receiving process to temporarily store a verbatim record of the received data stream. A structure called the "address string" be used by the receiving process to store the sequence of addresses which represent the received data stream. A structure called the output string may be used by the retrieving process to store the new instance of the originally received data stream. A structure called the processing array is used by the receiving process in finding in the index already indexed data groups. An example indicating use of the processing array is given in FIG. 13, again to be explained in detail below.

Referring now to the drawings and more particularly to FIG. 1 there is shown a flow diagram of the receiving process.

When a data unit is received by the structure operating system the data unit is processed 105. Because of the variable amount of time that mat be required for execution of the loop 110, the received data units may optionally be buffered 108. If the incoming data stream is buffered, then the next data unit is got from the buffer 110. The operating system then executes a search operation 118. The search is executed against the values in the values block using the value of the current data unit as the search key.

The search operation seeks to achieve a match. For example, when the data unit "street" is received by the operating system, the operating system searches for the word "street" among the stored data values.

When the match operation fails 118, that is, when the value of the data unit is not present in the values block, the operating system executes a write operation and writes the value to an available location in the values block 120. When the match succeeds 118 the operating system identifies the address of the location which holds the found data value.

When the current data value is the first this receiving session 125, the pointer PP is set to the address of the first array location 128. The location to which pointer PP points is called "location PP". The address of the current data value is written to location PP 135.

The operating system then returns 115 and starts to process the next data unit 110.

Figure 2:
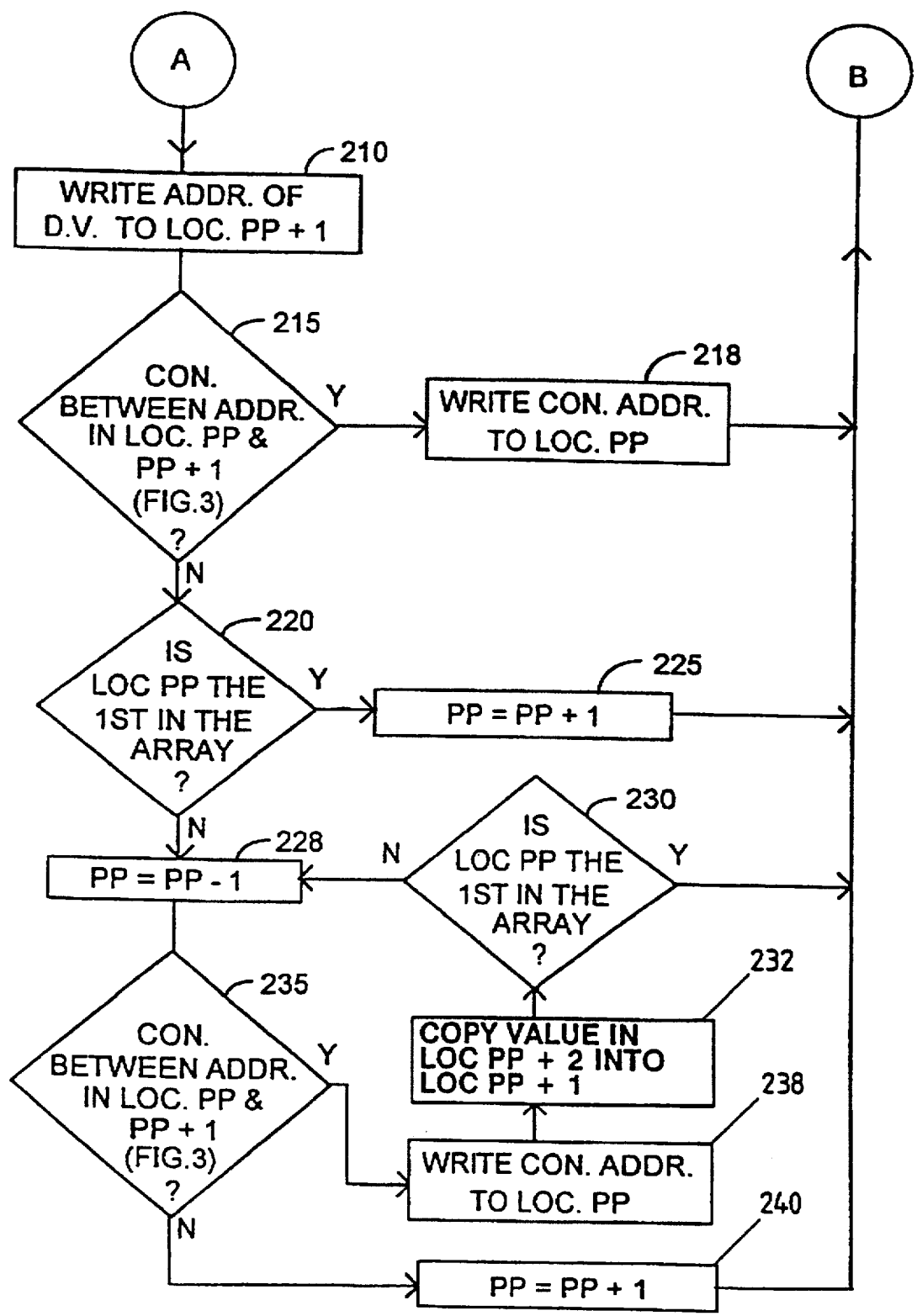

Now referring to FIG. 2 which is a continuation of FIG. 1, the operating system executes a write operation and writes the address of the next data unit's corresponding data value to the next available location (PP+1) in the processing array 210.

Figure 3:
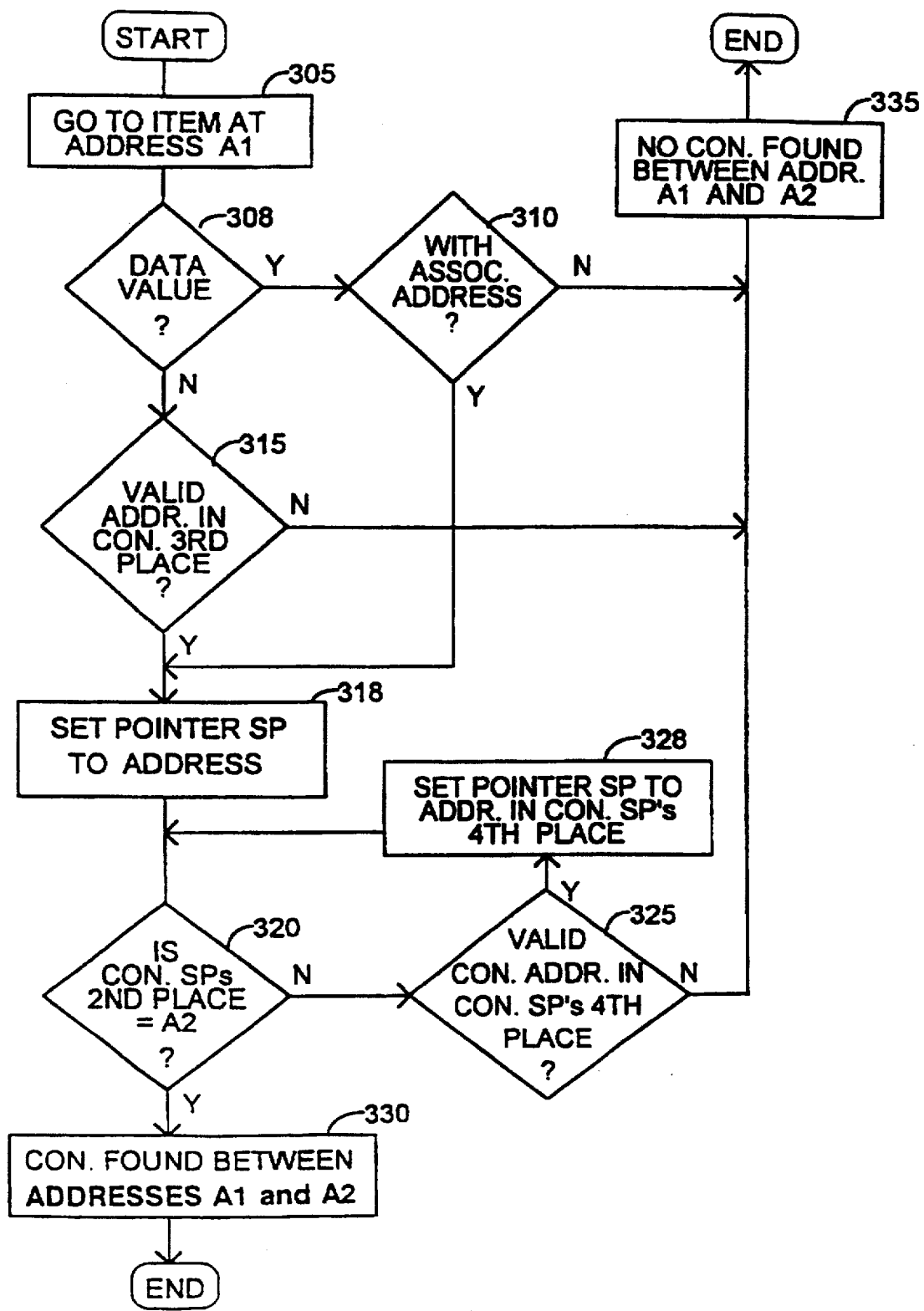
FIG. 3 is a flowchart illustrating the method within the receiving process of finding a connection.

There is now a pair of addresses in the processing array. The operating system now determines whether a connection in the index exists between the two addresses in this pair 215. (FIG. 3 illustrates the process of seeking a connection in the index.) If a connection exists then there is a connection where the first address in the connection is the same as the first address in the pair, and similarly, the second address in the same connection is the same as the second address in the pair.

When a connection is found between the addresses in the pair, the operating system writes the address of the connection to location PP 218 then returns and gets the next data unit 110. Pointer PP is not incremented. This has the effect of overwriting the previous address at location PP, and the address at location PP+1 is ignored (it will be overwritten with the address of the next data value). This is done because now that a connection is found, neither of the addresses in the pair need be stored. Only the address of the connection need be retained, because the addresses of the pair can always be found by unpacking the information contained in the connection.

When a connection is not found between the addresses in the pair 215, and location PP is the first location relating to this data stream 220, pointer PP is incremented by one 225, and the next data unit processed 110.

When a connection is not found and location PP is not the first location this receiving session, the pointer PP is decremented by one 228. The operating system then evaluates the pair starting at the new location PP, and searches for a connection in the index between the addresses in this pair 235.

When no connection is found, the operating system increments the primary pointer PP by one 240, therefore ensuring that the second address in the current pair is not now overwritten when the next data unit is processed, then gets the next data unit 110.

When a connection is found, the operating system writes the address of the connection to location PP 238. The effect of this is to overwrite the old address in location PP, and because pointer PP is decremented 228 before getting the next data unit 110, to discard the second address in the old pair. The reason for this is that now a connection has been found, there is no need to keep the pair, only the address of the connection which connects them. Discarding the second address in the old pair leaves a gap in the array, and this gap is closed up by executing a copy operation and copying the value at location PP+2 into location PP+1, 232, which is the location of the discarded address.

Referring now to the drawings and more particularly to FIG. 3 there is shown a flow diagram of the method within the receiving process of finding a connection, referred to in conditional branches 215 and 235 of FIG. 2. For the sake of exposition, the two addresses between which a connection is sought are given the names A1 and A2, and it is understood that in respect of FIG. 2 conditionals 215 and 235 that they refer to the addresses in locations PP and PP+1 respectively.

The operating system executes a read operation and reads the first address (A1) in the pair. The operating system then shifts its attention to the item at the location of that address 305. This item may be either a data value or a connection 308.

When it is a data value, the operating system looks for an associated address of a chain 310. If there is no associated address then the data value is not connected to anything 335 and the search process ends and returns failure. When an associated address does exist, then there is a chain in the next level up in a connection structure, and the operating system sets a pointer, called the "search pointer" (SP) to that address 318.

When the first address (A1) is the address of a connection, the operating system looks in the third place in the connection for the address of a chain 315. When there is no address in the third place then the connection is not connected to anything 335 and the search process ends and returns failure.

When there is a chain's address in the connection's third place 315, the operating system sets pointer SP to that address 318. This is the address of the associated chain. That is, if there is a chain associated with address A1, search pointer SP is now set to the address of that chain.

The address of the chain is also the address of the first connection in the chain. The connection which pointer SP points at its called "connection SP". The operating system reads the second address in connection SP and executes a match operation against address A2 320.

When connection SP's second address does not match A2, that is, when connection SP does not connect A1 to A2, the operating system moves along the chain, looking at the second address in each connection in the chain 325, 328, 320. If the address A2 is found 320, the process ends returning success and the address of connection SP. If the end of the chain is reached and A2 was not found in any of its connection second places 325, then the process ends 335 returning failure.

Figure 4:
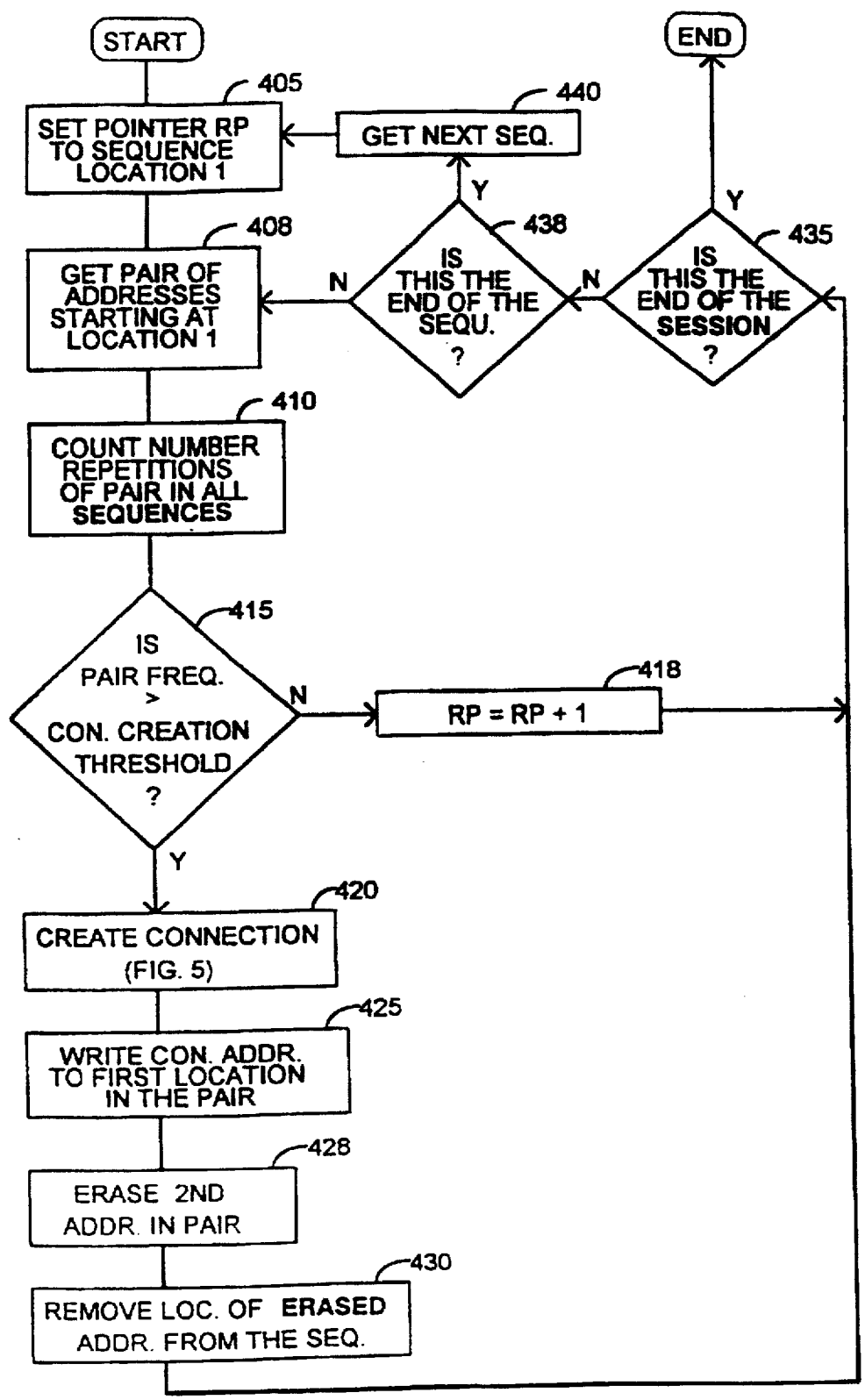
FIG. 4 and FIG. 5 are flowcharts illustrating the reorganising process.

Referring now to FIG. 4 there is shown a flow diagram of the reorganising process.

Connections are created by the operating system when it reorganises the index block. When an instance of the storage structure of the design of the present invention is first used, there are no connections in the index block, given that none has been imported from another computer, from storage media, or from elsewhere.

During a reorganisation session, the reorganisation process processes, typically in the order each was written, each stored address sequence which has not previously been processed by the reorganisation function in a prior reorganisation session. In a particular usage, the sequence may be, for example, the contents, which are addresses, of various fields in various files.

Such addresses are addresses either of data values or connections. The sequences of stored addresses represents the streams of data which were received. The representation is usually not a 1:1 representation; and as the index gets older, the same information will on subsequent occasions it is received, typically be stored as fewer addresses.

The operating system sets the reorganisation pointer RP to the first address of the first sequence to be processed this reorganisation session 405. It then starts execution of a loop operation 408 which reads each address in each sequence to be processed. Within a single reorganisation session, the operating system may read each such address, or its replacement, in each such sequence, a number of times.

Within the loop starting at 408, the operating system looks at each contiguous pair of addresses in a sequence. These pairs of contiguous addresses are referred to by the shortened term "pairs".

Typically, the second address of a pair would represent the information which was received by the operating system after receipt of the data which the first address represents. Another embodiment may formulate pairs in the reverse order, that is, where the first address of the pair represents data received directly after those represented by the second. In this latter case other functions of the operating system would need to take account of this reverse order within pairs. However, whether one way round or the other, the addresses in a pair must represent sections of data which were received by the operating system next to each other in time, that is, which were temporally contiguous.

For each contiguous pair of addresses, the operating system counts the number of times it occurs within all sequences to be processes this reorganisation session 410.

When no repetition is found, or when the frequency of repetition is less than or equal to a number called the "connection creation threshold" 415 the operating system increments the loop 418 and processes the next contiguous pair 408. The first address in the next pair is the second address in the current pair.

The operating system counts the frequency of occurrence of pairs which consists of the same addresses in the same order. The addresses which make up the pair must be in the same order. For example, the address in a sequence which yields the word "Sunset" and the address in a sequence which yields the word "Boulevard" might be found to occur together in that order 15 times during a reorganisation session. A pair of the same addresses in the reverse order is a different pair, not a different instance of the same pair, and might not normally be found.

When the current pair is found to be repeated with a frequency greater than the connection creation threshold, a connection is created in the index block in respect of that pair 420. The connection creation process is illustrated in FIG. 5.

The number of times a pair must be repeated to trigger the creation of a connection is dependent on the particular embodiment of the present invention, its particular use, and its maturity, and the data type in question, and would be expected to vary between embodiments. A connection between two given addresses in a given order, may be created once only. An embodiment may create connections after an invariant number of repetitions, or on some other basis, for example, on the basis of the top 20% of frequencies within the current reorganisation session, or, in order to moderate the growth of the index, as a function of the index's age or size.

Figure 5:
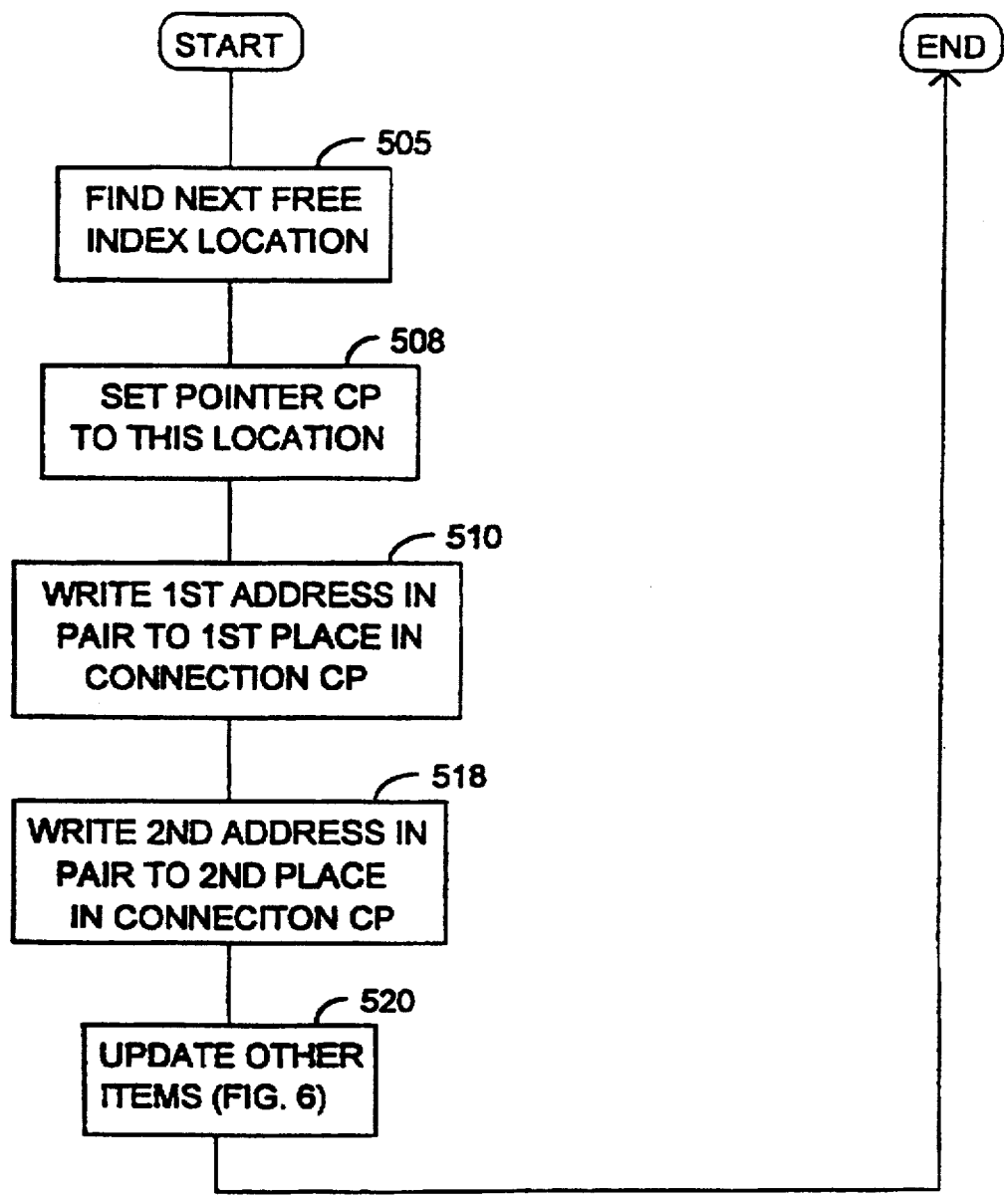

After a connection is created in the index 420 and FIG. 5 the address of the connection is written to the location of the first address in the pair 425 overwriting the original first address in the pair. The reason is that now a connection has been created between the two addresses in the pair, it is not necessary to keep both addresses; only the address of the connection need be retained. The second address in the pair is now redundant information, because this address is contained in the connection. The location which contains the second address is now ignored 428, 430. As far as the reorganisation process is concerned it does not exist. Various means may be used to achieve this end, for example, the rest of the sequence might be moved left one location to fill up the gap, or the location which holds the second address might be logically ignored, for example, where the first address in the pair is in location PP, the location in the sequence now pointed to by RP+1 is the location that would previously have been pointed to by RP+2.

After the location of the second address is removed from the sequence, the operating system tests whether the session is ended 435 or the sequence is ended 438. When the sequence is ended the next sequence is found 440 and the processing of that sequence started 408.

Referring now to FIG. 5 there is shown a flow diagram of the method within the reorganising process of creating a connection.

The operating system identifies the next location available in the index block for creation of a new connection 505, and sets a pointer, called the connection pointer (CP), to that location 508. The connection at that location is called "connection CP". The operating system then writes, starting at that location, the values which constitute the connection.

The first of the two addresses in the repeated pair is written to one of the places in connection CP; and the second, to another. In the present embodiment, the first address in the pair is written to the first place in the connection 510, although in some other embodiment it may be written to some other place in the connection; and likewise in the present embodiment, the second address in the pair is written to the second place in the connection 518. These addresses will, for the moment, be called the "first address" and the "second address" within a connection in virtue of being held respectively in the first and second places.

Figure 6:
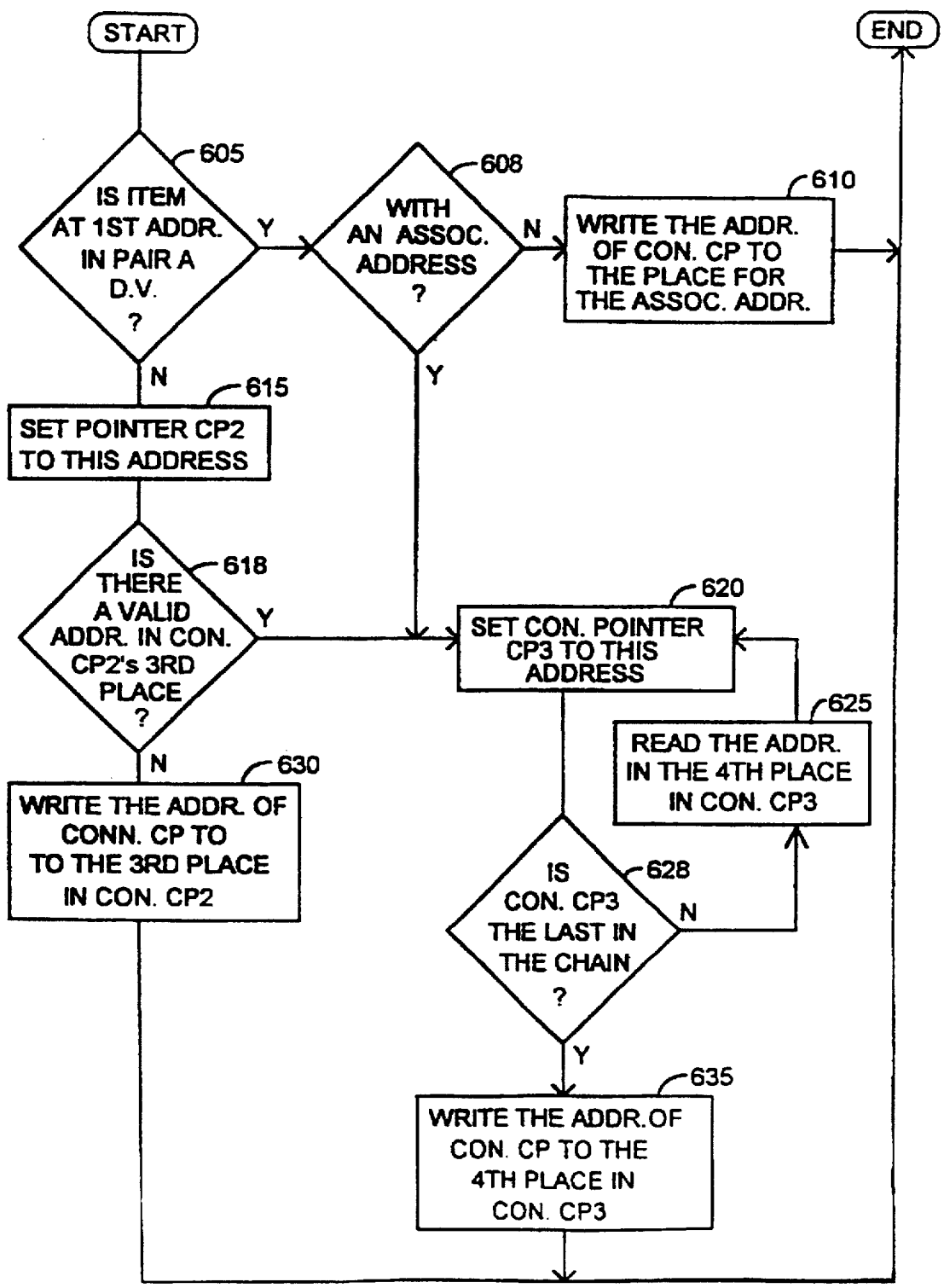

The operating system then updates other existing items in the storage structure in the manner illustrated in FIG. 6. 520. Then the connection creation process ends.

Referring now to FIG. 6, which is referred to in 520 of FIG. 5.

When the first address in the new connection CP is the address of a data value 605, the operating system determines if it has an associated address 608. When it doesn't, the operating system writes the address of connection CP to the place reserved for the data value's associated address 610 then ends the connection creation process.

When there is an associated address, then the connection pointer CP2 is set to the location of this address 615. The existence of an associated address means a chain exists in respect of this data value, on the next level up in a connection structure.

When the item at the location of connection CP's first address is itself a connection 605-N, the operating system sets the connection pointer CP2 to the address of this connection 615 then looks at the place in connection CP2 reserved for the address of the associated chain, if any 618. In the preferred embodiment this place is the third place in a connection, and an address there is called the "third address" in virtue of being in the third place.

When the third place in connection CP2 does not contain the address of a chain 618-N, the operating system executes a write operation and writes the address of connection CP to the third place in connection CP2 630 then writes the value zero to the fourth place, which identified this connection as the last in the chain.

To reiterate, a chain is a group of one or more connections each of which has the same first address. The address of the first connection in the chain is said to be the address of the chain. The chain "associated with" a given connection is the chain whose connections have as their first address the address of the given connection.

In the present embodiment each connection in the same chain, except the last, holds the address of the next connection in the chain. Other embodiments may store this information in some other form and/or place.

In the present embodiment, the fourth place in the connection is reversed for the address, if any, of the next connection in the chain. An address in this place is called the "fourth address" in virtue of it being in the fourth place.

The storage system contains the information which identifies the last connection in each chain. In the present embodiment, this information takes the form of a zero in the fourth place of the last connection, which identifies it as the last connection. Typically the order of the connections in a chain reflects the order in which the connections were created.

When the third place in connection CP2 does contain the address of a chain, the operating system then seeks to find the end of that associated chain then add the new connection to the end. The operating system sets the third connection pointer CP3 to the connection at the start of the chain 620.

The operating system then reads the value at the fourth place in connection CP3 628. This place is the place reserved for the address of the next connection in the chain.

When the fourth place contains the value zero, connection CP3, the first connection in the chain, is also the last in the chain, that is, it is the only connection in the chain. The operating system then executes a write operation and writes the address of connection CP to the fourth place in connection CP3 635.

When the fourth place contains a valid connection address 625 the operating system sets the third connection pointer CP3 to that connection 620 which then becomes the new connection CP3. This connection is the next connection in the chain.

This loop of reading the fourth address then going to the connection of that address continues until the value at the place reserved for the fourth address is zero, that is, until the end of the chain is reached 628-Y.

When the end of the chain is reached, the address of connection CP is written to the fourth place in connection CP3 635, therefore then making connection CP3 the next to last connection, and making the new connection the last connection. The value zero is written to the fourth place in connection CP. The connection creation process then ends.

Other mechanisms may be employed by a practitioner skilled in the art to instantiate this design of the structure of memory addresses and values; for example, by identifying the end member of the chain of connections by setting a flag in a part of the connection reserved from operating system-specific information other than addresses, or of holding the connection addresses in an index, rather than employing pointers to link one connection to the next. These variations are valid instantiations of the design and method of the present invention.

When a new connection is created in the index block, instances in the address sequence of the two relevant repeated values may be replaced with the address of the new connection, and the reorganisation process run again over the addresses being processed in the current reorganisation session. In this manner, groups in address sequences which are repeated and which consist of three or more addresses, may be established as structures of connections in the index.

Figure 7:
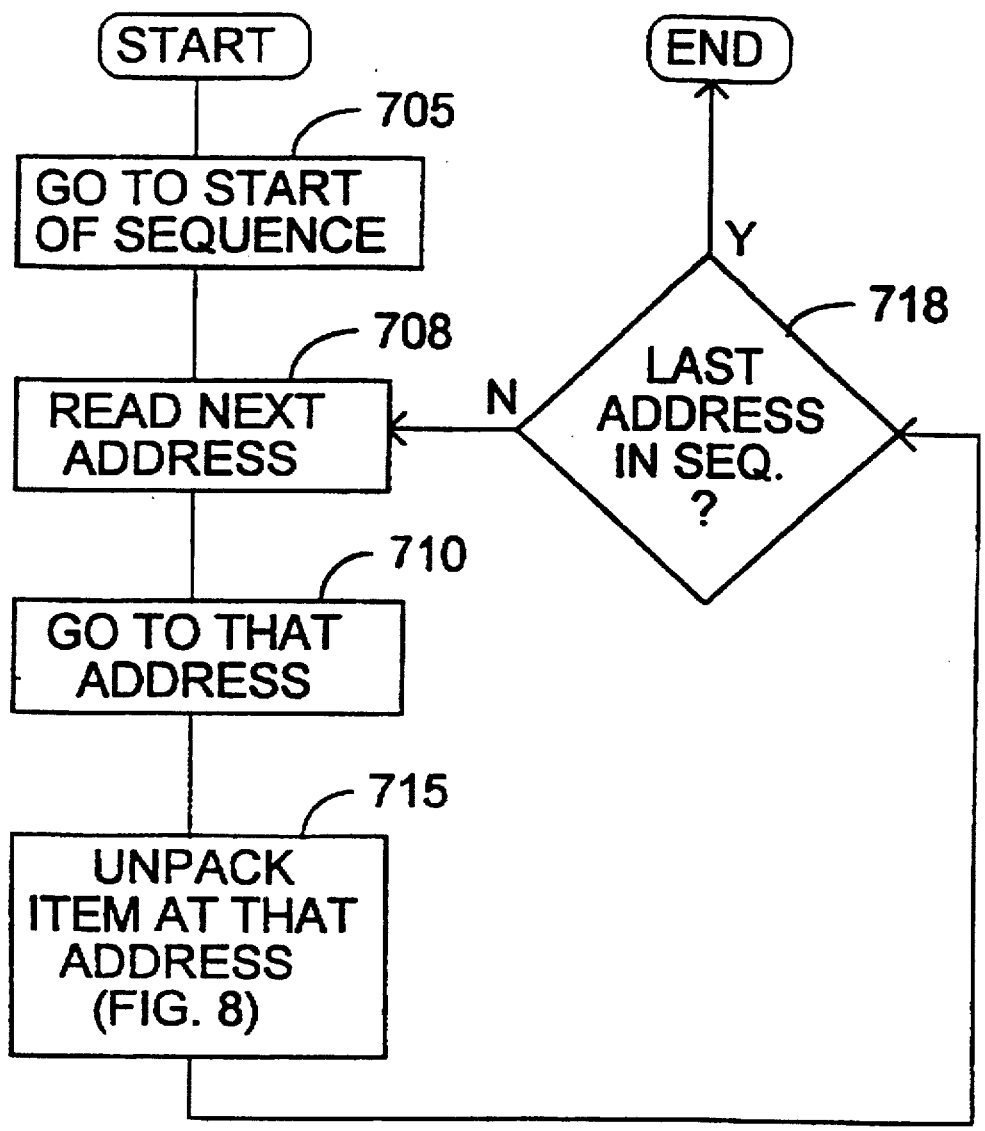
FIG. 7 and FIG. 8 are flowcharts illustrating the retrieving process.

Referring now to FIG. 7 there is shown a flow diagram of the retrieving process.

From each stored address the retrieving process unpacks the connection structure, if any, which branches out below the connection at that address in the index. The operating system thereby builds up the values which were originally received, and which the address represents.

In retrieving information previously stored, firstly, the operating system reserves an area of memory in the processing block called the output string. The output string is used by the operating system as a place to put the data values which constitute the retrieved information, when it determines those data values. In some embodiments, an output string may not be implemented, the retrieved data values being passed directly to the client process or on to another process.

Figure 8:
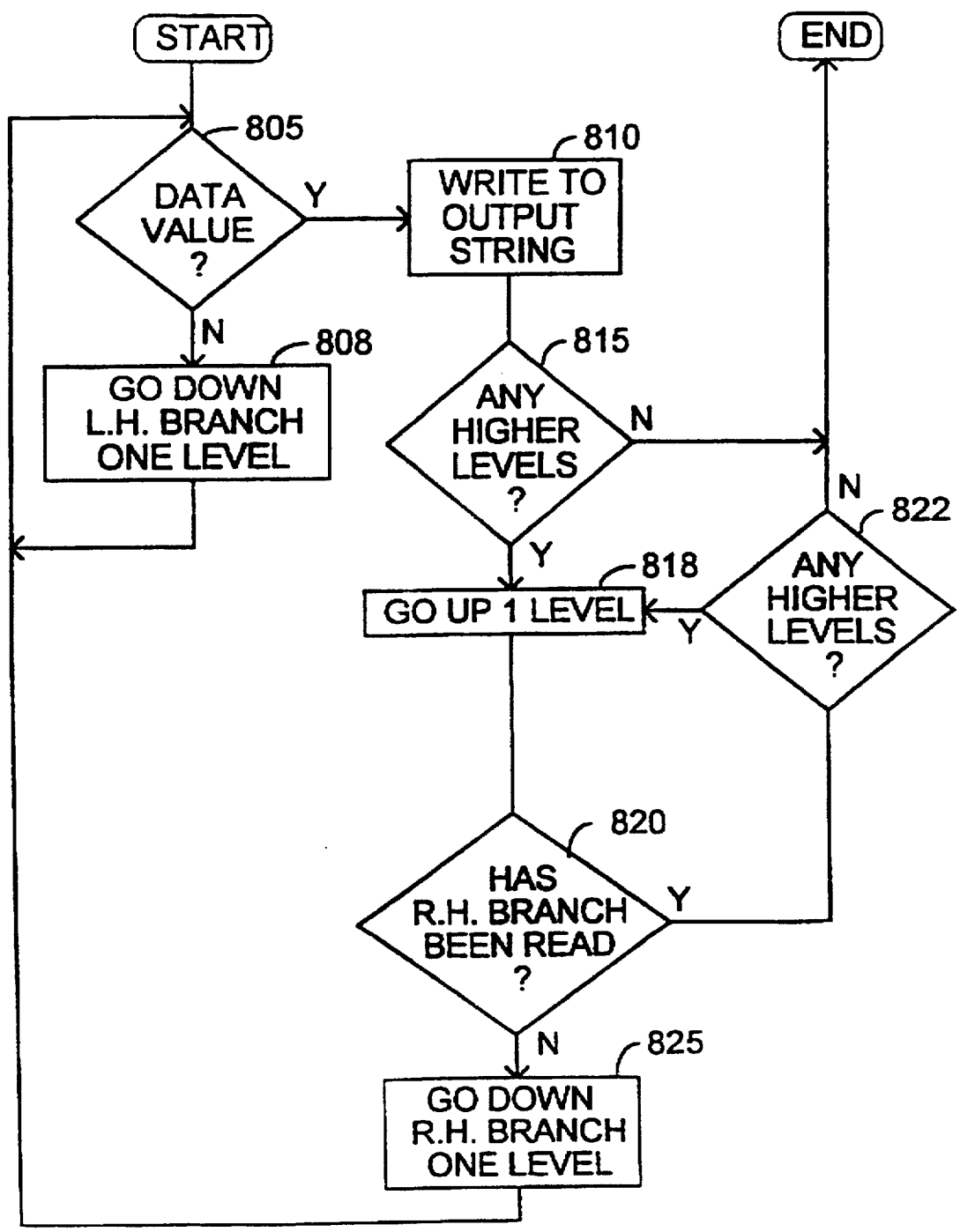

The retrieving process processes each address in each address sequence 705. The operating system reads the next address in the sequence 708, goes to that address 710 and retrieves the information which that address represents 715. FIG. 8 illustrates the process of unpacking such information. The operating system then tests for the end of the sequence 718 and when true 718-Y exits the retrieving process.

Referring now to FIG. 8. which is referred to in FIG. 7 item 715.

The operating system determines the type of the item at the current address 518. The type may be either data value or connection.

When it is a data value, the operating system writes the data value to the next available position in the output string 810.

When the address is the address of a connection 805-N, the operating system executes a loop 808 and reads down the left branches of the inverted tree connection structure (of which FIG. 12 is an example) which branches out below that address through various nodes (connections) to determine the data values on its lowest level.

When a data value is found and written to the output string, the operating system executes a conditional branch 815. When there are no higher levels (such as L0–L4 in FIG. 12) the unpacking process ends.

When a higher level exists, the operating system goes up one level 818. The operating system examines the connection on this higher level to determine whether the right hand branch has been read previously 820. When it hasn't, the operating system goes down the right hand branch and executes the loop starting in 805.

When the right hand branch has been previously read, the operating system checks to see if there is a higher level 822, and if there is, goes up to that level, then executes the loop starting in 820. When there is not a higher level, then the unpacking process ends.

The result of this process is that new instances of the original data values are written to the output string in the order in which they were originally received, thereby re-creating the original information.

This storage and retrieval process of the present invention allows efficient data storage in respect of certain types of data. For example, In a conventional storage system, when a user types "East 42nd Street" the letters are typically stored in a 1:1 ratio between typed items and stored items. Whereas in respect of the present invention, this information might be stored in a 16:1 ratio as one memory address which represents three words (taking "42nd" to be a word) which add up to 16 characters.

Considering a local body database which records the addresses of buildings. There are, say 1,000 buildings in East 42nd Street. Rather than storing the name East 42nd Street 1,000 times (consisting of a total of 16,000 characters), only 1,000 memory addresses need be stored.

Considering a national database of property addresses. The word "Street" may be stored, say, 20 million times, taking up 120 million characters. In respect of the present invention, only 20 million memory addresses need be stored. Even if a memory address is taken to occupy 4 bytes of storage and a character, one byte, the method of the present invention in this example represents a saving by compressing non-contiguous repetitions of groups of data values.

In the case where data units are words and numbers, certain sub-processes are required to manage peculiarities which do not arise in respect of other types of data and data units. Spaces, capitalization, punctuation, and special characters may be processed by special sub-processes. For example, a space may be considered to be appended to a word; or to delimit a data value (word) rather than constitute a data value itself. A punctuation mark may be always represented as the address of its respective data value, and not form parts of connections; capitalization may be ignored, or alternatively, might be identified by a connection flag or series of connection flags which identify the letter or letters capitalised.

In the case where data units are characters, a data stream, of English text for example, would have no need for any particular type or variety of data unit to be predetermined as a delimiter. The connection structure would therefore be formed including spaces or any other data unit which might ordinarily be used to separate words, as mentioned above. Data units considered in this fashion would be of a generally uniform length, such as a seven bit ASCII character, possibly with or without a number of additional bits.

Referring now to FIG. 9 there is shown a specific illustrative example of the contents of part of a data values block. For example a character "a" 901 is stored in a location of a certain address 902 (namely address 100586) and associated with which is an "associated address" 903 (namely 103765).

Referring now to FIG. 10 there is shown a specific illustrative embodiment of a chain of connections which starts at address 219550 1002 and which are associated with the data value "c". Where there is a first address 1001 in the first connection which is the address of the first item connected ("c"), a second address 1003 which is the address of the second item connected (respectively "a", "e", "o" ... moving down the page), a third address 1004 which is the address of the associated chain which is on the next level up in the connection structure (arbitrary in this example), a fourth address 1005 which is the address of the next connection in the chain on the same level, and a place for other information used by the operating system 1006.

Referring back to the data value "c" at address 100650 in FIG. 9 and referring to the connection at address 327645 in FIG. 10 a particular connection establishing "co" can be seen.

Referring now to FIG. 11 there is shown a specific illustrative embodiment of the chain associated with the address that yields "co". The second address in each case indicates the various connections between "co" and other data values (respectively "a", "o", "n" ... moving down the page). The second address could also normally indicate another connection.

Referring now to FIG. 12 there is shown a specific illustrative embodiment of a connection structure which yields the word "company" using addresses from FIGS. 9, 10, 11. Each location where a branching occurs is called a level L, and the bottom of the structure is called the bottom level L0. For example, the leftmost branches travel down indirectly through nodes, which are connections, and different and lower levels to the data value "c". There are five levels between (and including) the data value "c" and the address 890123, illustrated by the values L0–L4 on the left side of the figure. Whereas there are only two additional levels between the data value "y" and the address 890123, illustrated by the values L0–L2 on the right side of the figure.

890123 is the address of the top-level connection and the address of the structure. It is this single address which, in this example, is stored when the word "company" is received as a character data stream by the operating system. The numbers below this address illustrate a connection structure which yields the word "company", and would typically be set up as a result of reorganisation following a number of receiving processes according to FIGS. 1 to 6.

In order to later reproduce from the structure what was originally received, the operating system from the single top-level address 890123 follows the lower level connections down and across the structure to yield the word "company", in the manner illustrated in FIG. 7 and FIG. 8.

Connection structures of different levels and branchings might also, in a different embodiment or in the same embodiment at a different time, point to the word "company". Alternatively, there might not be a single top-level address which yields the word "company". The word "company" might, for example, be stored as two addresses which yield, through their two respective connection structures, the strings "comp" and "any". Or the word "company" could, in a poorly organised or young system, be stored as the addresses of its data values: 100650, 100610, 100634, 100682, 100586, 100666 and 100647 or some crude abstraction of them, such as 327645, 100634, 100682, 321098 and 100647.

Referring now to FIG. 13 there is shown a specific illustrative embodiment of the contents of a processing array during receipt of the word "company", given that the connections shown in FIG. 12 are already in existence. The addresses in the array locations relate to the addresses in FIG. 9, FIG. 10, FIG. 11, FIG. 12 and FIG. 14. The process which operates in respect of this array is illustrated in FIG. 1, FIG. 2 and FIG. 3.

The letter or data unit "c" is first received and identified in relation to address 100650, which is written in location 1 of the processing array. The letter "o" is then received and its address in the values block is written to location 2. A connection is then found to exist at address 327645 and replaces both, in location 1. The letters "m" and "p" are then received, and again existing connections are identified, resulting the address 795228 being stored as a compression of "comp".

The letter "a" is then received, but no connection between 795228 and 100586 exists. The letter "n" is then received and a connection between 100586 and 100666 is identified, and stored as address 321098, representing "an". Similarly a connection between 321098 and 100674 is identified as 678901 on receiving the letter "y". Finally an existing connection between 795228 and 678901 ("comp" and "any") is identified and stored as 890123.

Referring now to FIG. 14 there is shown a specific illustrative comparison between what is received, what is stored, and what is retrieved. This simply shows that improvement of 7:1 has been achieved in storing the word "company" at a single memory address.

Referring now to FIG. 15 there is shown a specific illustrative embodiment of a connection structure which points to the word "common" which illustrates an efficiency which may be achieved in information structures of this design. Namely that the same connection substructure 327651 which exists in FIG. 12 in respect of the word "company" also exists in FIG. 15 in respect of the word "common". Here connection 327651 ("com") is connected to 100634 ("m") rather than 100682 ("p"). Connectors 932655 and 795228 could form part of a chain.

Referring now to FIG. 16 there is shown a specific illustrative embodiment of a connection structure which yields the street name "East 42nd Street". This indicates how whole phrases or even sentences may be compressed as a result of reorganisation processing, in respect of a data unit type being a complete word, providing they occur sufficiently frequently.

Figure 17:
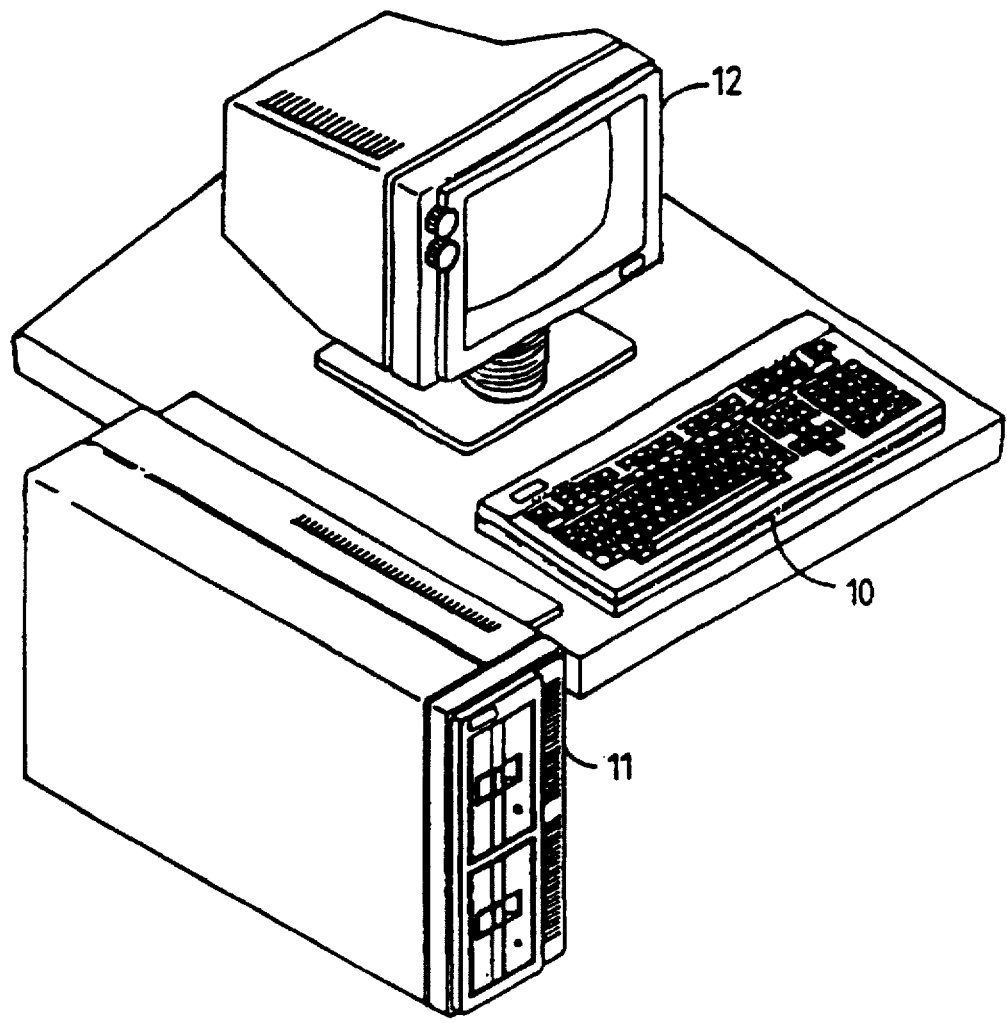
FIG. 17 is a perspective view of a computer system on which the invention might be used.

Referring to FIG. 17 there is shown by way of example only, for completeness of the description, a desktop computer station in which a system incorporating software according to the present invention could be implemented. It will be understood that the system could also be implemented in a wide range of computer or communications equipment or other equipment for the purpose of data storage and compression.

Although the specific connections are not shown, the work station comprises a keyboard 10 for user input, which would normally be connected to a processor/disc drive box 11, and in turn to a video display unit 12. Other items of equipment such as a data scanner, modem or printer may or may not also be present. The station might also be connected as part of a network and server system. Data entered through the keyboard or downloaded from an external source could be compressed and stored at the station according to the invention.

Figure 18:
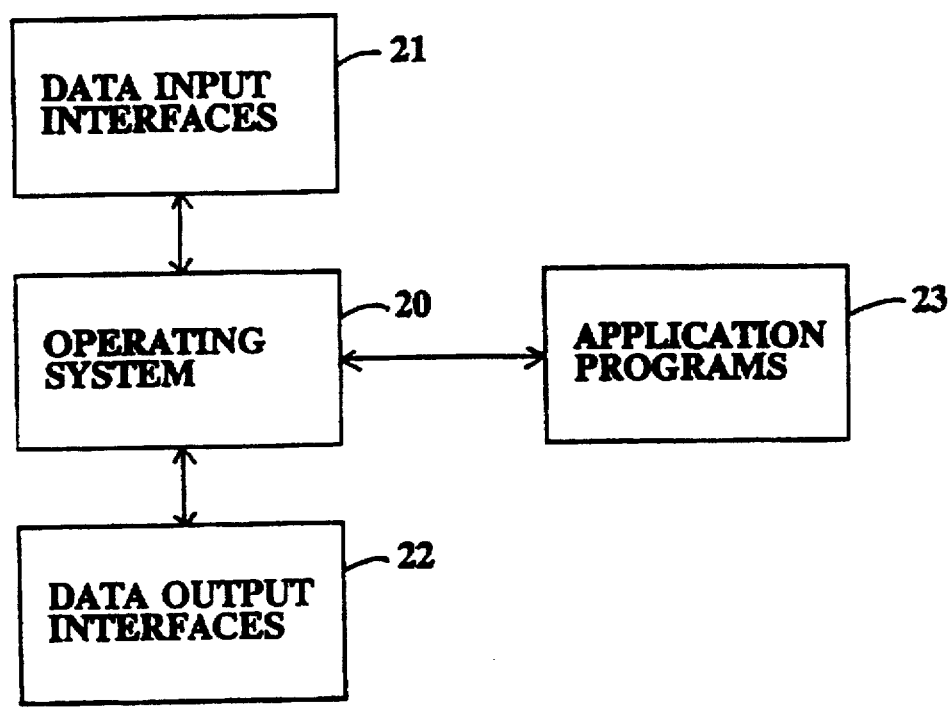
FIG. 18 is a generalised software system which may be implemented on the computer station of FIG. 17.

Referring to FIG. 18 there is shown again by way of example, which will be fully appreciated by the skilled person, a generalised software system which may be implemented on the computer station of FIG. 17. The work station is controlled by operating system software 20 which functions in conjunction with a number of application programs 23 which may be chosen by a user. Data compression according to the present invention may be implemented as part of the operating system 20 or as a separate application program 23. Data may be input from a variety of sources such as the keyboard or a scanner, through a data input interface 21. Compressed data may be output to an external storage medium such as a disc drive, or transmitted to a remote site, through a data output interface 22.

The particular method of implementing the present invention may vary depending on a number of factors including the particular computer, type(s) of data, programming language, and the intended use of the invention. In adapting the teachings of the present invention to different applications, those of ordinary skill in the art will modify the preferred embodiment described herein. Accordingly, the invention should not be limited by the foregoing description of the preferred embodiment, but rather should be interpreted in accordance with the following claims.

I claim:

1. A method of compressing data by computer, in which connection groups of two or more consecutive data units are identified and recorded as compression proceeds, comprising:

receiving a stream of data units to be compressed, with no predetermined variety of data unit having significance as a delimiter of other data units, storing a record of each received data unit in a processing block of computer memory, determining whether each received data unit forms an already identified connection group existing in an index block of computer memory, when considered in relation to any immediately preceding data unit or connection group recorded in said processing block, storing in said processing block a fresh record of any such already identified connection group formed by said received data unit, in place of said received data unit and said immediately preceding data unit or connection group recorded in said processing block, determining whether each connection group freshly recorded in said processing block forms a larger already identified connection group existing in said index block, when considered in relation to any respective immediately preceding data unit or connection group recorded in said processing block, storing a further fresh record of any such larger already identified connection group, in place of said connection group freshly recorded in said processing block and said respective immediately preceding data unit or connection group recorded in said processing block, delivering the records stored in said processing block for further storage or for transmission as required, once said stream of data units has been received and compressed.

2. A method according to claim 1, in which at least one data stream has been received and stored, further comprising:

determining a number of occurrences of at least one pair of consecutive records in said received data, determining whether the number of occurrences of said at least one pair of consecutive records exceeds a threshold number, storing in said index block a record of a new connection group for any such pair of consecutive records in said received data having a number of occurrences greater than said threshold number, storing in said received data a record of said new connection group in place of each occurrence of said consecutive pair of records which said new connection group represents.

3. A method according to claim 2, comprising, repeatedly, storing records of connection groups representing consecutive pairs of records having at least the threshold number of occurrences, until no further such pairs can be found.

4. A method of compressing data according to claim 1, further comprising:
   determining whether each received data unit exists in a values block of already identified data units or is a new data unit,
   storing a record of each new data unit in said values block.

5. A method according to claim 1 wherein the data units are of a substantially uniform length.

6. A method according to claim 5 wherein the data units are characters or image pixels.

7. A method of compressing data by computer, comprising, repeatedly, receiving a new data stream and storing an initially compressed data stream wherein connection groups of two or more consecutive data units are identified and recorded as compression proceeds by performing the steps of:
   receiving a stream of data units to be compressed, with no predetermined variety of data unit having significance as a delimiter of other data units,
   storing a record of each received data unit in a processing block of computer memory,
   determining whether each received data unit forms an already identified connection group existing in an index block of computer memory, when considered in relation to any preceding data unit or connection group recorded in said processing block,
   storing in said processing block a fresh record of any such already identified connection group formed by said received data unit, in place of said received data unit and said immediately preceding data unit or connection group recorded in said processing block,
   determining whether each connection group freshly recorded in said processing block forms a larger already identified connection group existing in said index block, when considered in relation to any respective immediately preceding data unit or connection group recorded in said processing block,
   storing a further fresh record of any such larger already identified connection group, in place of said connection group freshly recorded in said processing block and said respective immediately preceding data unit or connection group recorded in said processing block,
   delivering the records stored in said processing block for further storage or for transmission as required, once said stream of data units has been received and compressed, and
   reorganizing said initially compressed data stream by creating and storing new connection groups wherein at least one data stream has been received and stored by performing the steps of:
   determining a number of occurrence of at least one pair of consecutive records in said received data,
   determining whether the number of occurrences of said at least one pair of consecutive records exceeds a threshold number,
   storing in said index block a record of a new connection group for any such pair of consecutive records in said received data having a number of occurrences greater than said threshold number,
   storing in said received data a record of said new connection group in place of each occurrence of said consecutive pair of records which said new connection group represents.

8. A structure in computer memory, comprising a plurality of records of data units and a plurality of records of connections, wherein:
   each record of a data unit represents the respective data unit, and the presence or absence of a chain of records of connections in which the data unit is represented, and
   each record of a connection represents a respective connection relationship between two data units, two connection relationships, and data unit and a connection relationship, or a connection relationship and a data unit, and the presence or absence of a chain of records of connections in which the respective connection relationship is in turn represented as part of further relationships.

9. A structure according to claim 8, wherein each record of a connection has primary and secondary components which represent the two data units, the two connection relationships, the data unit and connection relationship, or the connection relationship and data unit.

10. A structure according to claim 9, wherein each record of a connection has a further component which represents the presence or absence of another record of a connection having a primary component in common with said each record of a connection.

11. A structure according to claim 9, wherein each record of a connection has a further component which represents the presence or absence of another record of a connection having a primary component which represents said each record of a connection.

12. A structure according to claim 9, wherein each said chain of records of connections in which the data unit is represented contains every such record of a connection in which the data unit is represented as the primary component.

13. A structure according to claim 9, wherein each said chain of records of connections in which the respective connection relationship is represented contains every such record of a connection in which the connection relationship is represented as the primary component.

14. A structure according to claim 9, wherein the primary and secondary components of each record of a connection are related by their consecutive occurrence in a data stream.

15. Computer apparatus containing program instructions which create a data structure according to claim 8.

16. A method of compressing a data stream, in which a groups of data units are replaced by connection representations from an existing data structure, including the steps of:
   (a) storing a newly received data unit in a processing array which has already received at least one data unit,
   (b) searching the data structure for a connection representation to replace the newly received data unit and a preceding data unit or preceding connection representation in the array,
   (c) storing the connection representation in the array if located in (b) as a replacement for the newly received data unit and the preceding data unit or connection representation as the case may be,
   (d) searching the data structure for a further connection representation to replace the newly stored connection representation in (c) and a respective preceding data unit or preceding connection representation in the array,
   (e) storing the further connection representation in the array if located in (d), as a replacement for said newly stored connection representation and said respective preceding data unit or preceding connection representation in the array, (f) repeating steps (d) to (e) until no further connection representation is located, and (g) repeating steps (a) to (f) until no further data unit is received.

17. A method according to claim 16 further including the steps of:

(h) scanning the data stream which has been compressed according to steps (a) to (g) to determine the number of occurrences of each consecutive data unit pair, connection representation pair, data unit and connection representation pair, or connection representation and data unit pair, (i) storing a new connection representation in the data stream to replace each pair determined in (h) for which the number of occurrences is greater than a threshold number, and (j) storing each new connection representation in the data structure.

18. A method according to claim 16 wherein no predetermined variety of data unit has significance as a delimiter of other data units.

19. Computer apparatus containing program instructions which implement a method according to claim 16.

* * * * *